(12) United States Patent
Bunch et al.

(10) Patent No.: US 6,891,414 B1
(45) Date of Patent: May 10, 2005

(54) DIGITAL CALIBRATION FOR CAPACITOR VOLTAGE NON-LINEARITY

(75) Inventors: Ryan Lee Bunch, Greensboro, NC (US); Scott Robert Humphreys, Greensboro, NC (US); Barry Travis Hunt, Jr., Greensboro, NC (US); Paul Gerard Martyniuk, Somerville, MA (US); Christopher Truong Ngo, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 100 days.

(21) Appl. No.: 10/794,861

(22) Filed: Mar. 5, 2004

(51) Int. Cl.[7] .................................................. H03L 7/06
(52) U.S. Cl. ...................................... 327/156; 327/147
(58) Field of Search ............................... 327/147, 148, 327/150, 156, 157, 159

(56) References Cited

U.S. PATENT DOCUMENTS

| | | | |
|---|---|---|---|
| 6,046,646 A | * 4/2000 | Lo et al. ......................... | 331/10 |
| 6,542,040 B1 | * 4/2003 | Lesea ............................ | 331/11 |
| 6,560,452 B1 | 5/2003 | Shealy .......................... | 455/333 |
| 6,624,702 B1 | 9/2003 | Dening ......................... | 330/297 |
| 6,674,818 B1 | 1/2004 | King et al. .................... | 375/343 |
| 6,683,905 B1 | 1/2004 | King et al. .................... | 375/141 |
| 6,693,468 B2 | 2/2004 | Humphreys et al. ......... | 327/105 |
| 6,710,664 B2 | 3/2004 | Humphreys et al. ......... | 331/11 |
| 6,724,265 B2 | 4/2004 | Humphreys ................... | 331/17 |
| 6,731,145 B1 | * 5/2004 | Humphreys et al. ......... | 327/156 |
| 2003/0016088 A1 | * 1/2003 | Scheffler ...................... | 331/100 |
| 2003/0133518 A1 | 7/2003 | Koomullil et al. ........... | 375/326 |
| 2003/0209730 A1 | 11/2003 | Gibson et al. ............... | 257/201 |
| 2004/0072597 A1 | 4/2004 | Epperson et al. ............ | 455/572 |

* cited by examiner

Primary Examiner—Timothy P. Callahan
Assistant Examiner—Cassandra Cox
(74) Attorney, Agent, or Firm—Withrow & Terranova, PLLC

(57) ABSTRACT

The present invention provides a system for adjusting a selectable capacitance of a variable capacitance array to compensate for voltage non-linearity of the variable capacitance array. In general, the system includes the variable capacitance array and a calibration circuit. The calibration circuit operates to determine a voltage across the variable capacitance array and to generate a capacitance selection signal based on the voltage across the variable capacitance array and a known capacitance versus voltage characteristic of the variable capacitance array.

23 Claims, 6 Drawing Sheets

DIGITAL CALIBRATION FOR CAPACITOR VOLTAGE NON-LINEARITY

FIELD OF THE INVENTION

The present invention relates to digitally calibrating a variable capacitor array to increase voltage linearity, and more particularly relates to digital calibration of variable capacitor arrays in a loop filter of a phase-locked loop.

BACKGROUND OF THE INVENTION

Frequency synthesizers are commonly used to generate radio frequency (RF) signals for use in communication systems. A common form of frequency synthesizer is the charge pump based phase-locked loop (PLL).

Modern communication systems, such as the Global System for Mobile Communication (GSM) cellular telephone system, impose strict requirements on the locktime and noise performance of the transmitted signal, and on the signals used for mixing in the receiver. For example, the transmit locktime must typically be under $250\,\mu s$ to settle the frequency synthesizer output frequency to under 100 Hz error, the transmitted phase noise must be under −113 dBc/Hz at 400 kHz offset, and the phase error of the transmitted signal must remain small (under 5 degrees root-mean-square in the GSM system). If the loop bandwidth of the PLL is too wide, the noise performance specification may not be met, and if the loop bandwidth is too narrow, the locktime specification may not be met. Further, variations in loop gain and bandwidth can degrade the performance of fractional-N frequency synthesizer based transmit systems in which a predistortion filter is used to compensate for the rolloff of frequency response of the PLL.

Variations in the gain and bandwidth of the PLL are due to variations inherent to transistor, resistor, and capacitor devices in low cost semiconductor processes. One such variation is the capacitance versus voltage characteristic of capacitors in the loop filter of the PLL. The variation of the capacitors in the loop filter with respect to voltage leads to variations in the loop bandwidth and gain, thereby degrading the locktime, noise, and phase error of the frequency synthesizer.

Thus, there remains a need for a calibration system to cancel out the undesirable process and environmental variations that degrade the performance of integrated frequency synthesizers while providing a desired, arbitrary level of accuracy with minimal overhead in terms of device area and calibration time. Ideally this calibration system should function automatically, with little or no user intervention, and the calibration should complete rapidly enough to be performed each time the frequency synthesizer is enabled.

One such system is disclosed in commonly owned U.S. patent application Ser. No. 10/409,291 filed Apr. 8, 2003, which is incorporated herein by reference in its entirety. The present invention relates to improving this system by compensating for the voltage non-linearity of the capacitors in the loop filter, thereby improving the performance of the frequency synthesizer.

SUMMARY OF THE INVENTION

The present invention provides a system for adjusting a selectable capacitance of a variable capacitance array to compensate for voltage non-linearity of the variable capacitance array. In general, the system includes the variable capacitance array and a calibration circuit. The calibration circuit operates to determine a voltage across the variable capacitance array and to generate a capacitance selection signal based on the voltage across the variable capacitance array and a known capacitance versus voltage characteristic of the variable capacitance array.

In one embodiment, the present invention is implemented as part of a phase-locked loop. The phase-locked loop includes a loop filter having one or more variable capacitance arrays and a calibration circuit. The calibration circuit operates to determine a voltage across each of the variable capacitance arrays and to generate one or more capacitance selection signals based on the voltages across the variable capacitance arrays and a capacitance versus voltage characteristic of the variable capacitance arrays. The calibration circuit may further operate to calibrate the pole and zero locations and the gain of a charge pump phase-locked loop's (PLL) frequency response.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention provides a system for adjusting a selectable capacitance of a variable capacitance array to compensate for voltage non-linearity of the variable capacitance array. As described in detail below, the present invention may be implemented as part of a phase-locked loop (PLL). However, the present invention may be implemented in any system having a variable capacitor array wherein compensation for voltage non-linearity of the variable capacitor array is desirable.

Figure 1:
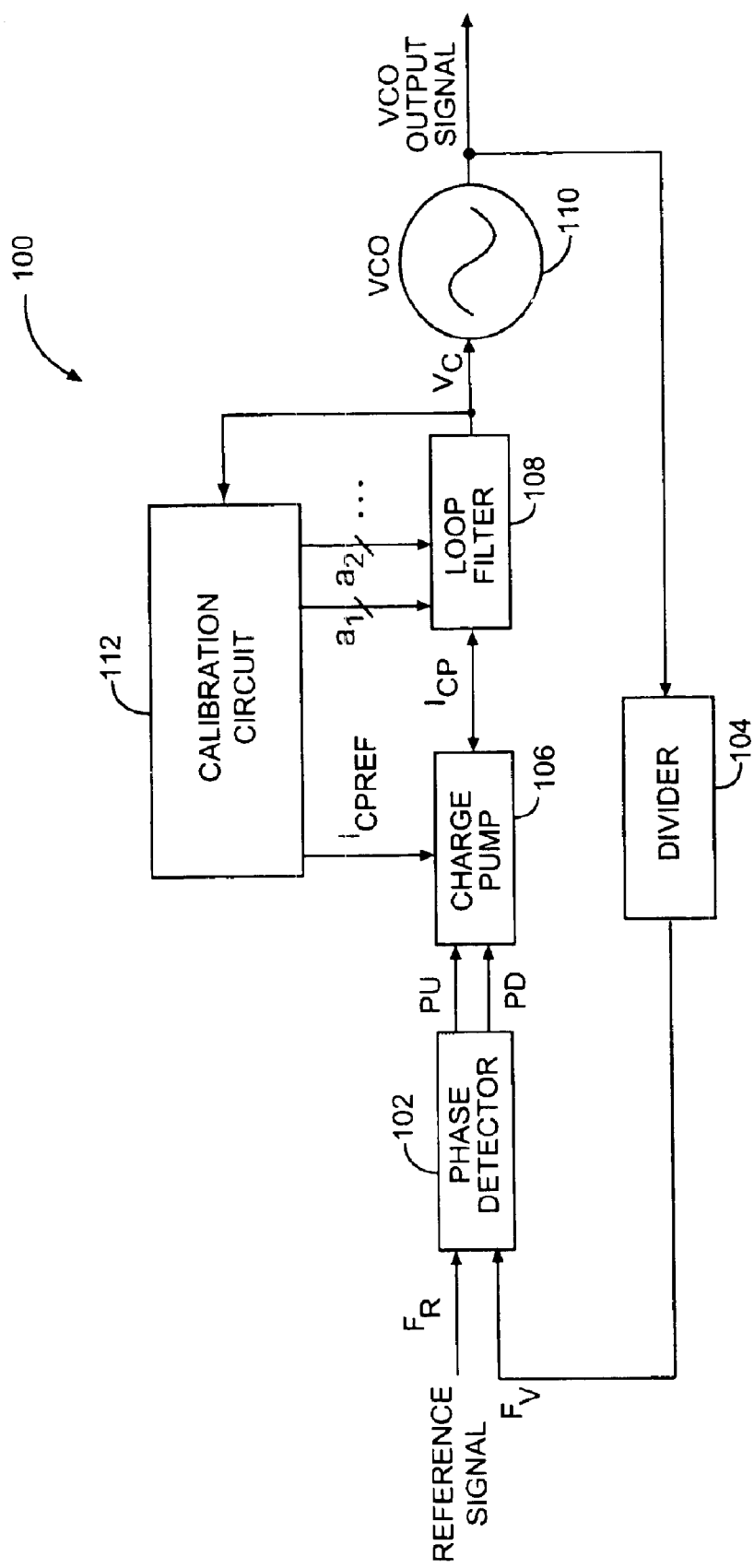
FIG. 1 is a simplified block diagram of the preferred embodiment of the phase-locked loop of the present invention.

Referring to FIG. 1, a phase-locked loop 100 is illustrated according to one embodiment of the present invention. A phase detector 102 is typically an asynchronous digital logic circuit that pulses either a pump up (PU) or a pump down (PD) signal for the duration of time between rising edges on a reference signal (FR) and a divided VCO (Fv) signal, wherein the divided VCO signal is from a divider 104. The PU and PD signals cause a charge pump 106 to source one or more pulses of current ($I_{CP}$) to a loop filter 108 or sink one or more pulses of current ($I_{CP}$) from the loop filter 108, wherein the charge pump current ($I_{CP}$) is typically generated by an integrated current reference (not shown). The pole and zero locations are also determined by resistor and capacitor device characteristics. The loop filter 108 is typically a passive or active RC filter, and the one or more pulses of current are integrated and stored by capacitance of the loop filter 108 as charge. The output voltage ($V_C$) of the loop filter 108 is a function of this charge, and acts as a control voltage for a voltage controlled oscillator (VCO) 110. The calibration circuit 112 acts to remove various types of error from the PLL 100. The divider 104 is typically a programmable integer or fractional divider, which is used to set the output frequency of the VCO 110. The PLL 100 acts as a feedback control system to drive the phase (and therefore frequency) error of the $F_R$ and $F_V$ signals to zero. Since $F_V = F_{VCO}/N$, where N is the divider modulus, the VCO frequency is set to $F_{VCO} = N \, F_R$.

Figure 2:
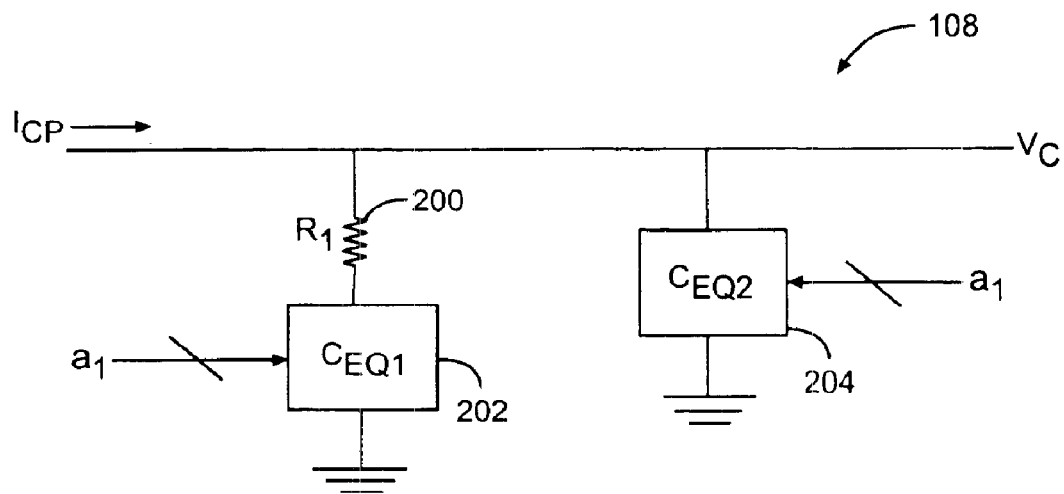
FIG. 2 illustrates a simplified loop filter according to one embodiment of the present invention.

The behavior of the PLL 100 in terms of noise and dynamic response is determined by the loop gain of the system. The loop gain is given by:

$$G(s) = \frac{I_{CP} K_v F(s)}{sN},$$

where s is the Laplace frequency variable, $I_{CP}$ is the charge pump current in amperes (A), $K_V$ is the tuning gain in cycles-per-second-per-volt (Hz/V), F(s) is the loop filter transfer function, and N is the VCO divider modulus. Further, an exemplary embodiment of the loop filter 108, as illustrated in FIG. 2, includes a loop filter resister ($R_1$) 200, first variable capacitor array ($C_{EQ1}$) 202, and second variable capacitor array ($C_{EQ2}$) 204 and has the following transfer function:

$$F(s) = \frac{1}{sC} \frac{(s\tau_z + 1)}{(s\tau_p + 1)}$$

where $$C = C_{EQ1} + C_{EQ2},$$

$$\tau_z = R_1 C_{EQ1}, \quad \tau_p = \left(\frac{R_1 C_{EQ1} C_{EQ2}}{C_{EQ1} + C_{EQ2}}\right) = R_1 C_{EQTOTAL},$$

and $$C_{EQTOTAL} = \frac{C_{EQ1} C_{EQ2}}{C_{EQ1} + C_{EQ2}}.$$

Substituting these expressions for F(s):

$$G_{ol} = \frac{K_V}{s^2 N} \left(\frac{I_{CP}}{C}\right) \frac{sR_1 C_1 + 1}{sR_1 C_{EQTOTAL} + 1}.$$

Therefore, the loop gain depends on the transfer function of the loop filter 108 and more particularly on the slew rate (I/C). Further, the transfer function, F(s), of the loop filter 108 of the present invention depends on the capacitance of $C_{EQ1}$ and $C_{EQ2}$, which are controlled by a capacitance selection signal ($a_1$) from the calibration circuit 112. As illustrated in FIG. 1, the calibration circuit 112 may provide one or more capacitance selection signals ($a_1$, $a_2$, ... ). However, for the exemplary embodiment of the loop filter 108 illustrated in FIG. 2, only one capacitance selection signal ($a_1$) is needed.

Figure 3:
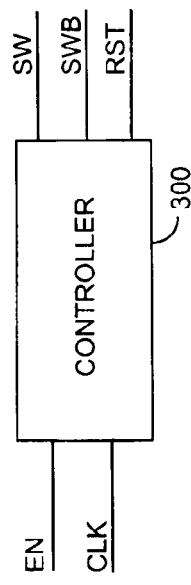
FIG. 3 illustrates a controller of the calibration circuit according to one embodiment of the present invention.
Figure 4:
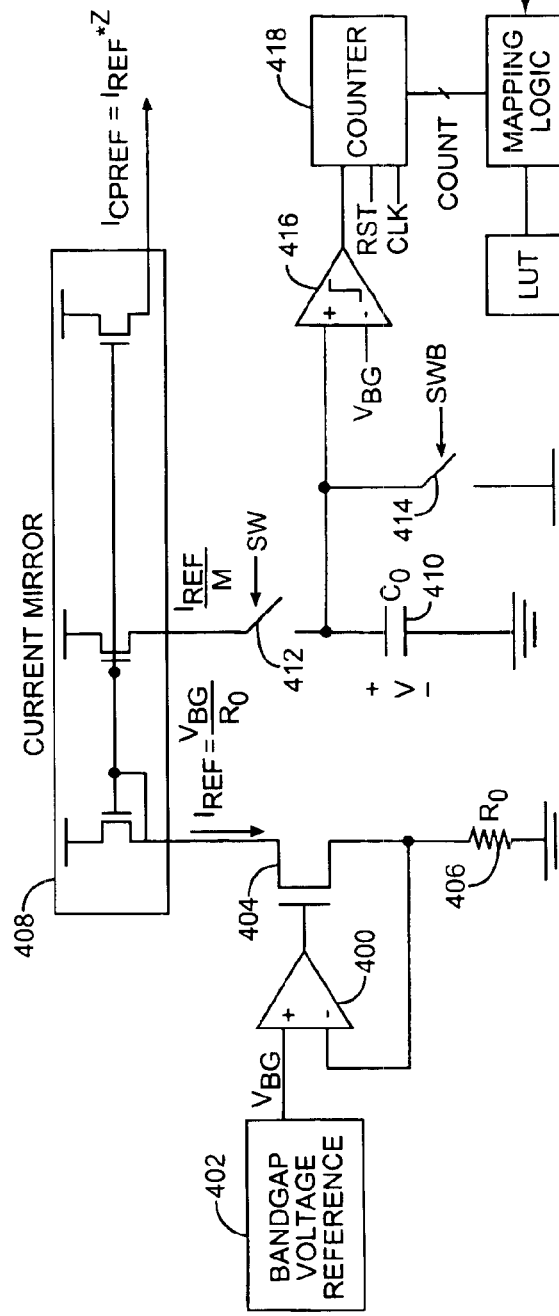
FIG. 4 illustrates the calibration circuit according to one embodiment of the present invention.

FIGS. 3 and 4 illustrate a calibration controller 300 associated the calibration circuit 112, and show the calibration circuit 112 in more detail, respectively. The calibration circuit 112 provides RC time constant and slew rate (I/C) calibration. According to the present invention, the calibration circuit 112 also controls the first and second variable capacitor arrays 202 and 204 to compensate for non-linearity of the capacitance versus voltage characteristics of each of the arrays 202 and 204.

The calibration controller 300 of FIG. 3 is preferably, but not necessarily, part of the calibration circuit 112. The controller 300 asserts or deasserts a first switch control signal (SW), a second switch control signal (SWB), and a reset signal (RST) depending on an enable signal (EN), which in one embodiment may be a frequency synthesizer enable signal from the controller of a mobile telephone, and a reference clock signal (CLK). FIG. 4 illustrates the calibration circuit 112 including a first voltage comparator 400, a bandgap voltage reference 402, a transistor 404, a resistor ($R_0$) 406, a current mirror 408, a capacitance circuit, and a detection and control circuit. The capacitance circuit includes a capacitor ($C_0$) 410, a first switch 412, and a second switch 414, and the detection and control circuit includes a second voltage comparator 416, a counter 418, mapping logic 420, analog-to-digital converter 422, and a look-up table (LUT) 424.

In order to fully appreciate the calibration controller 300 and calibration circuit 112 as shown in FIGS. 3 and 4, the correlation between the RC time constant and the slew rate is first described. First, the loop gain constant can be expressed as a function of the nominal loop gain and the tolerances on the various component terms:

$$G_{ol} = \frac{I_{CPo} K_V}{N_o C_o} \frac{(1 + \varepsilon_I)(1 + \varepsilon_{KV})}{(1 + \varepsilon_N)(1 + \varepsilon_C)},$$

where the $\varepsilon_x$ terms are error factors for each nominal value term. The RC time constants are simply determined by:

$$RC = R_o C_o (1 + \varepsilon_R)(1 + \varepsilon_C).$$

These equations demonstrate that there are five sources of variation: VCO tuning gain ($\varepsilon_{KV}$), charge pump reference current ($\varepsilon_I$), loop divider value ($\varepsilon_N$), and resistor ($\varepsilon_R$) and capacitor ($\varepsilon_C$) tolerance. The VCO tuning gain may be calibrated by a separate system, or may be controlled by design to be within a given range. The loop divider value is known from the design or, in the preferred embodiment, from the programming of the IC. This leaves the slew rate (I/C) and the RC time constant values. The RC time constant and the slew rate can be calibrated independently against timing from the stable reference source, such as a 13 or 26 MHz crystal oscillator. However, the calibration circuit 112 correlates the RC time constant and the slew rate, and therefore a single calibration is used to calibrate both the RC time constant and the slew rate.

Calibration adjustments can be viewed as correction factors that null out the variations from the various sources of error, setting the loop gain and RC time constant equal to their desired, nominal values. Thus, ignoring variation on the VCO divider modulus, N, and the tuning gain, $K_V$, we can determine correction factors for the slew rate ($a_{IC}$) and the RC time constant ($a_{RC}$):

$$G_{ol} = \frac{a_{IC} I_{CPo} K_V}{N_o C_o} \frac{(1+\varepsilon_I)}{(1+\varepsilon_C)} = \frac{a_{IC} I_o K_v}{N_o C_o} \Rightarrow a_{IC} = \frac{(1+\varepsilon_C)}{(1+\varepsilon_I)} \text{ and}$$

$$RC = a_{RC} R_o C_o (1+\varepsilon_R)(1+\varepsilon_C) = R_o C_o \Rightarrow a_{RC} = \frac{1}{(1+\varepsilon_R)(1+\varepsilon_C)}.$$

If the charge pump reference current ($I_{CPREF}$) is derived from a known voltage reference, such as the bandgap voltage reference 402, and the resistor ($R_0$) 406 is of the same type as used in the filter 108, the correction factors for the loop gain via the slew rate and the RC time constant become correlated, to within the accuracy of the bandgap voltage reference 402, which should be quite good:

$$I_{CPREF} = I_{CPREFo}(1+\varepsilon_I) = zI_{REFo}(1+\varepsilon_I) = \frac{zV_{BG}}{R_o}\frac{(1-\varepsilon_{BG})}{(1+\varepsilon_R)} \Rightarrow$$

$$(1+\varepsilon_I) = \frac{(1+\varepsilon_{BG})}{(1+\varepsilon_R)} \Rightarrow a_{IC} = \frac{(1+\varepsilon_R)(1+\varepsilon_C)}{(1+\varepsilon_{BG})} = \frac{1}{a_{RC}(1+\varepsilon_{BG})},$$

where $I_{CPREF}$ is defined as the product of $I_{REF}$ and z, and z is a known constant defined by the ratio of the current mirror 408. Therefore, by deriving the charge pump reference current from the bandgap voltage reference 402 and the resistor ($R_0$) 406, which define the reference current ($I_{REF}$), one calibration can set both the loop gain and pole/zero locations based on the RC time constant and the slew rate.

During calibration, the first variable capacitor array ($C_{EQ1}$) and the second variable capacitor array ($C_{EQ2}$) are adjusted, via the signal $a_1$, such that the RC time constant is correct, as measured against the reference clock:

$$\frac{V}{T} = \frac{I}{C} = \frac{IR}{T} \Rightarrow RC = T.$$

Because we set the current by $V_{BG}/R_0$, the slew rate can be defined as:

$$\frac{I}{C} = \frac{V_{BG}}{T}.$$

In effect, by adjusting the capacitance of the first variable capacitance array ($C_{EQ1}$) and the second variable capacitance array ($C_{EQ2}$) via the signal a, such that the slew rate is correct, then the RC time constant will also be correct if the filter resistor 200 is similarly adjusted and built from the same material. The use of two stable references, the bandgap voltage reference 402 and the frequency reference, allows both calibrations with one measurement.

The following equations illustrate the effect. From the RC calibration:

$$a_{RC}RC = a_{RC}R_oC_o(1+\varepsilon_R)(1+\varepsilon_C) = R_oC_o \Rightarrow a_{RC} = \frac{1}{(1+\varepsilon_R)(1+\varepsilon_C)}.$$

Then $$\frac{I_{CPREF}}{C} = \frac{V_{BG}}{RC} = \frac{V_{BG}}{a_{RC}RC} = \frac{V_{BG}}{a_{RC}R_oC_o(1+\varepsilon_R)(1+\varepsilon_C)}$$

$$= \frac{V_{BG}}{R_oC_o} = \frac{I_{CPREFo}}{C_o},$$

where R and C are the actual values of the resistor 406 and the capacitor 410 and $R_0$ and $C_0$ are the nominal values of the resistor 406 and the capacitor 410.

The RC time constant with calibration can be described as:

$$RC = R_oC_o(1+\varepsilon_{RC})\left(\frac{C_{base}}{C_o} + \frac{RC_{VAL}}{(2^b-1)}\frac{C_{var}}{C_o}\right) = R_oC_o,$$

where the error factor ($1+\epsilon_{RC}$) is equal to the product of the resistor and capacitor error terms ($1+\epsilon_R)(1+\epsilon_C$), $C_{base}$ is the fixed capacitance, $C_{var}$ is the total value of the switched element array, $RC_{VAL}$ is the value of the capacitance selection signal ($a_1$) prior to adjusting for the non-linearity in the capacitances of the switched element array, and b is the number of bits or switched elements in the variable array. $RC_{VAL}$ can range from 0 to $2^b-1$.

We can determine the required values of $C_{base}$ and $C_{var}$ from the minimum and maximum values of $\epsilon_{RC}$, which occur when $RC_{VAL}=0$ and $RC_{VAL}=2^b-1$, respectively.

$$C_{base} = \frac{C}{(1+\varepsilon_{RC\,max})}$$

$$C_{var} = C_o\left(\frac{1}{(1+\varepsilon_{RC\,min})} - \frac{1}{(1+\varepsilon_{RC\,max})}\right).$$

The number of switched elements determines the resolution, or the residual error after calibration.

For measurement, we use the counter 418 running at a rate, $F_{clk}$ to determine the time it takes to charge $C_0$ from ground to $V_{BG}$. A nominal count value, $\text{count}_0$ is given by:

$$\text{count}_o = TF_{clk} = \frac{V_{BG}C}{I}F_{clk} = MR_oC_oF_{clk},$$

where M is a mirror reduction ratio, which decreases the reference current, thereby providing the timing current ($I_{REF}/M$) to the capacitor ($C_0$) 410. Reducing the value of the reference current to provide the timing current provides the ability to increase the number of counts or decrease the reference values of $R_0$ 406 and $C_0$ 410 to keep the area of the IC reasonable.

The count obtained for the actual RC circuit will deviate from the nominal value by an amount dependent on the resistor and capacitor error terms:

$$\text{count}=MR_oC_oF_{clk}(1+\epsilon_{RC})=\text{count}_0(1+\epsilon_{RC}).$$

This allows the development of a mapping between the count value and the value $RC_{VAL}$.

$$R_a C_o (1 + \varepsilon_{RC}) \left( \frac{C_{base}}{C_o} + \frac{RC_{VAL}}{(2^b - 1)} \frac{C_{var}}{C_o} \right) = R_o C_o \Rightarrow$$

$$\left( \frac{C_{base}}{C_o} + \frac{RC_{VAL}}{(2^b - 1)} \frac{C_{var}}{C_o} \right)$$

$$= \frac{1}{(1 + \varepsilon_{RC})} = \frac{count_o}{count} \Rightarrow RC_{VAL}$$

$$= (2^b - 1) \left[ \frac{count_o}{count} - \frac{C_{base}}{C_o} \right] \frac{C_o}{C_{var}}.$$

This mapping between the counter value and the value $RC_{VAL}$ allows the design to be parameterized and reused for different resolutions. It should be noted that the mapping logic 420 performs this mapping for each of the capacitance selection signals ($a_1$–$a_M$). As discussed above, only the capacitance selection signal ($a_1$) is needed for the embodiment of the loop filter 108 of FIG. 2. However, other embodiments of the loop filter 108 may require more than one of the capacitance selection signals ($a_1$–$a_M$) as discussed below with respect to FIGS. 7–8.

According to the present invention, the mapping logic 420 adjusts the value $RC_{VAL}$ to compensate for the voltage non-linearity of the switch capacitor arrays. The following discussion focuses on the generation of the capacitance selection signal ($a_1$) for the loop filter 108 of FIG. 2. However, for other embodiments of the loop filter 108, the mapping logic 420 may generate more than one of the capacitance selection signals ($a_1$, $a_2$, . . . ), and it should be recognized that the mapping logic 420 performs the operation described above for each of the capacitance selection signals ($a_1$, $a_2$, . . . ).

The capacitance of each of the first variable capacitance array ($C_{EQ1}$) and the second variable capacitance array ($C_{EQ2}$) may be defined as:

$$C_{EQ} = C_{base} + RC_{VAL} \times C_{unit}, \text{ where}$$

$$C_{unit} = \frac{C_{var}}{2^b}.$$

If each element of the first variable capacitance array ($C_{EQ1}$) and the second variable capacitance array ($C_{EQ2}$) is made from the same material, matching is excellent. Thus, $$K = \frac{C_{base}}{C_{unit}},$$

where K is a known constant. Further, the voltage non-linearity of the first variable capacitance array ($C_{EQ1}$) and the second variable capacitance array ($C_{EQ2}$) is known and is the same for both the unit ($C_{unit}$) and base ($C_{base}$) portions of the arrays. Thus, for each of the first variable capacitance array ($C_{EQ1}$) and the second variable capacitance array ($C_{EQ2}$), the mapping logic 420 determines a correction factor ($X_C$).

$$X_C = \frac{C_{desired}}{C_{actual}(v)},$$

when the value $RC_{VAL}$ is equal to its nominal value, where v denotes a voltage across the first variable capacitance array ($C_{EQ1}$) and the second variable capacitance array ($C_{EQ2}$). For the loop filter 108 illustrated in FIG. 2, the voltage (v) is equivalent to the control voltage ($V_C$). In one embodiment, the correction factor ($X_C$) is determined by selecting a value from the look-up table 424 based on the voltage ($V_C$) from the loop filter 108, where the voltage ($V_C$) is the voltage across the first variable capacitance array ($C_{EQ1}$) and the second variable capacitance array ($C_{EQ2}$). Although it is disclosed that the mapping logic 420 selects the correction factor ($X_C$) from the look-up table 424 based on the voltage ($V_C$), it should be noted that in another embodiment of the calibration circuit 112, the mapping logic 420 calculates the correction factor ($X_C$) based on the voltage ($V_C$) using a mathematical formula.

The mapping logic 420 can be made more robust by breaking the correction factor ($X_C$) into a process independent portion multiplied by a scaling factor for the particular implementation, where $$X_C = \frac{C_{min}}{C(v)} \times \frac{C_{desired @ nominal RC_{VAL}}}{C_{min @ nominal RC_{VAL}}}.$$

Next, the mapping logic 420 calculates a new $RC_{VAL}$ ($RC_{VAL}'$) based on the correction factor ($X_C$) and the value $RC_{VAL}$. The value $RC_{VAL}'$ is the value of the binary capacitance selection signal ($a_1$). The value $RC_{VAL}'$ is an adjusted version of the value $RC_{VAL}$ that compensates for the voltage non-linearity of the first variable capacitance array ($C_{EQ1}$) and the second variable capacitance array ($C_{EQ2}$), and is defined as:

$$C_{base} + RC_{VAL}' \times C_{unit} = X_C (C_{base} + RC_{VAL} \times C_{unit}), \text{ and recall that}$$

$$C_{base} + RC_{VAL}' \times C_{unit} = X_C (C_{base} + RC_{VAL} \times C_{unit}), \text{ and recall that}$$

$$K = \frac{C_{base}}{C_{unit}}, \Rightarrow RC_{VAL}' = X_C(K + RC_{VAL}) - K.$$

$$\Rightarrow RC_{VAL}' = X_C(K + RC_{VAL}) - K.$$

Thus, in general, the mapping logic 420 first maps the count value (count) to an RC calibration value ($RC_{VAL}$). In order to compensate for the voltage non-linearity of the corresponding variable capacitance array, the mapping logic 420 determines a correction factor ($X_C$) for the RC calibration value ($X_C$) based on the voltage across the corresponding variable capacitance array and a known capacitance versus voltage characteristic of the variable capacitance array. For the embodiment of the loop filter 108 illustrated in FIG. 2, the voltage across the first variable capacitance array ($C_{EQ1}$) and the second variable capacitance array ($C_{EQ2}$) is essentially the control voltage ($V_C$). The mapping logic 420 uses the correction factor ($X_C$) and the RC calibration value ($RC_{VAL}$) to generate the corresponding capacitance selection signal ($a_1$, $a_2$, . . . ).

Figure 5:
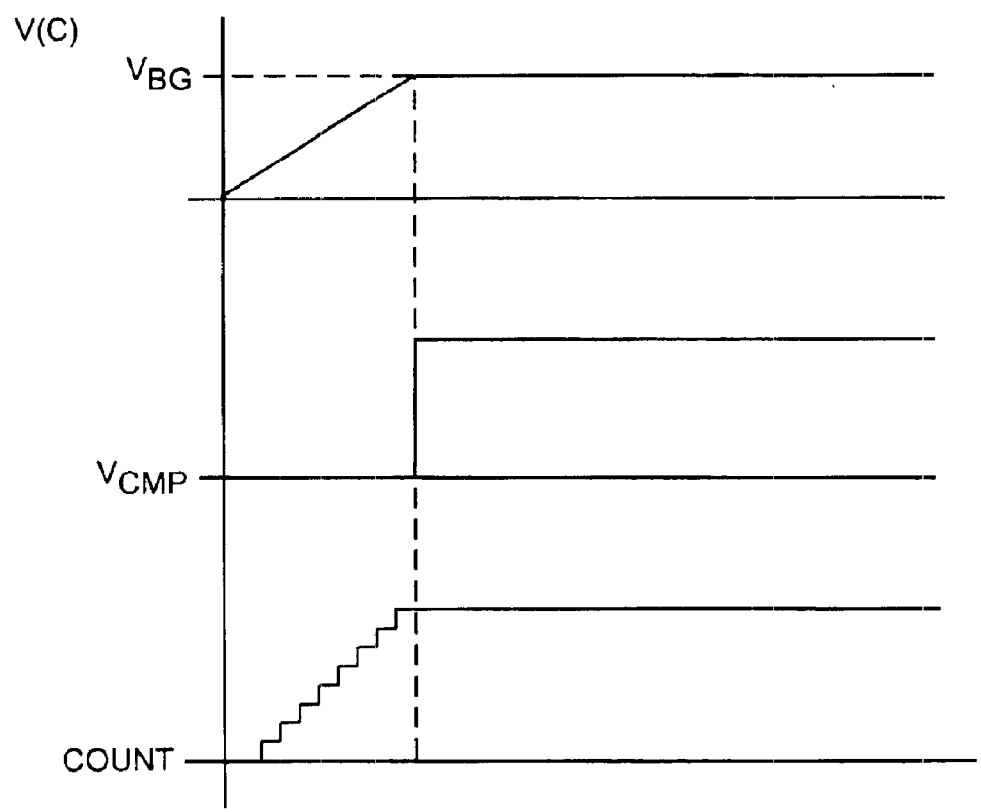
FIG. 5 illustrates the relationship between capacitor voltage, voltage comparator output, and counter state of the calibration circuitry according to one embodiment of the present invention.

Still referring to FIGS. 3 and 4, the calibration controller 300 is enabled by an external enable signal (EN), such as an enable signal for the frequency synthesizer, and by a reference clock source (CLK), which may also run the counter 418. The reference clock for the calibration controller 300 and the reference clock for the counter 418 do not need to be the same clock but the counter 418 must run off of a known, stable frequency reference. In one embodiment, the external enable signal (EN) may be controlled by a host microprocessor in a cellular phone. When the enable signal is deasserted (inactive), the counter 418 is reset and the capacitor ($C_0$) 410 is shorted to ground (SW is deasserted, SWB is asserted), guaranteeing that the capacitor ($C_0$) 410 is discharged before calibration starts. When the enable signal is asserted, the controller 300 asserts SW to close the first switch 412 in the charging circuit, deasserts SWB to open the second switch 414 thereby removing the short to ground, and deasserts the counter reset signal (RST) allowing the counter 418 to begin counting. As illustrated in FIG. 5, the counter 418 continues to run until the voltage ($V_C$) on the capacitor ($C_0$) 410 rises above the reference (bandgap) voltage thereby triggering the comparator 416, which freezes the counter 418. Note that the voltage reference does not need to be a bandgap voltage, but may be any stable, known voltage reference. The value in the counter 418 indicates the elapsed time, and therefore the slew rate. This counter value is then mapped, as discussed above, to the RC calibration value ($RC_{VAL}$). Based on the voltage across the variable capacitor arrays, which for the embodiment of the loop filter 108 of FIG. 2 is the control voltage ($V_C$), the mapping logic 420 determines a correction factor ($X_C$) that is used to compensate the RC calibration value ($RC_{VAL}$) for the voltage non-linearity of the elements of the first and second variable capacitor arrays, 202 and 204, in the bop filter 108. Based on the correction factor ($X_C$) and the RC calibration value ($RC_{VAL}$), the mapping logic 420 provides the appropriate switch setting to the first and second variable capacitor arrays, 202 and 204, in the loop filter 108 via the capacitance selection signal ($a_1$). The capacitance selection signal ($a_1$) may be used by other RC filters on the IC, assuming they use the same type of resistor and capacitor device.

Figure 6:
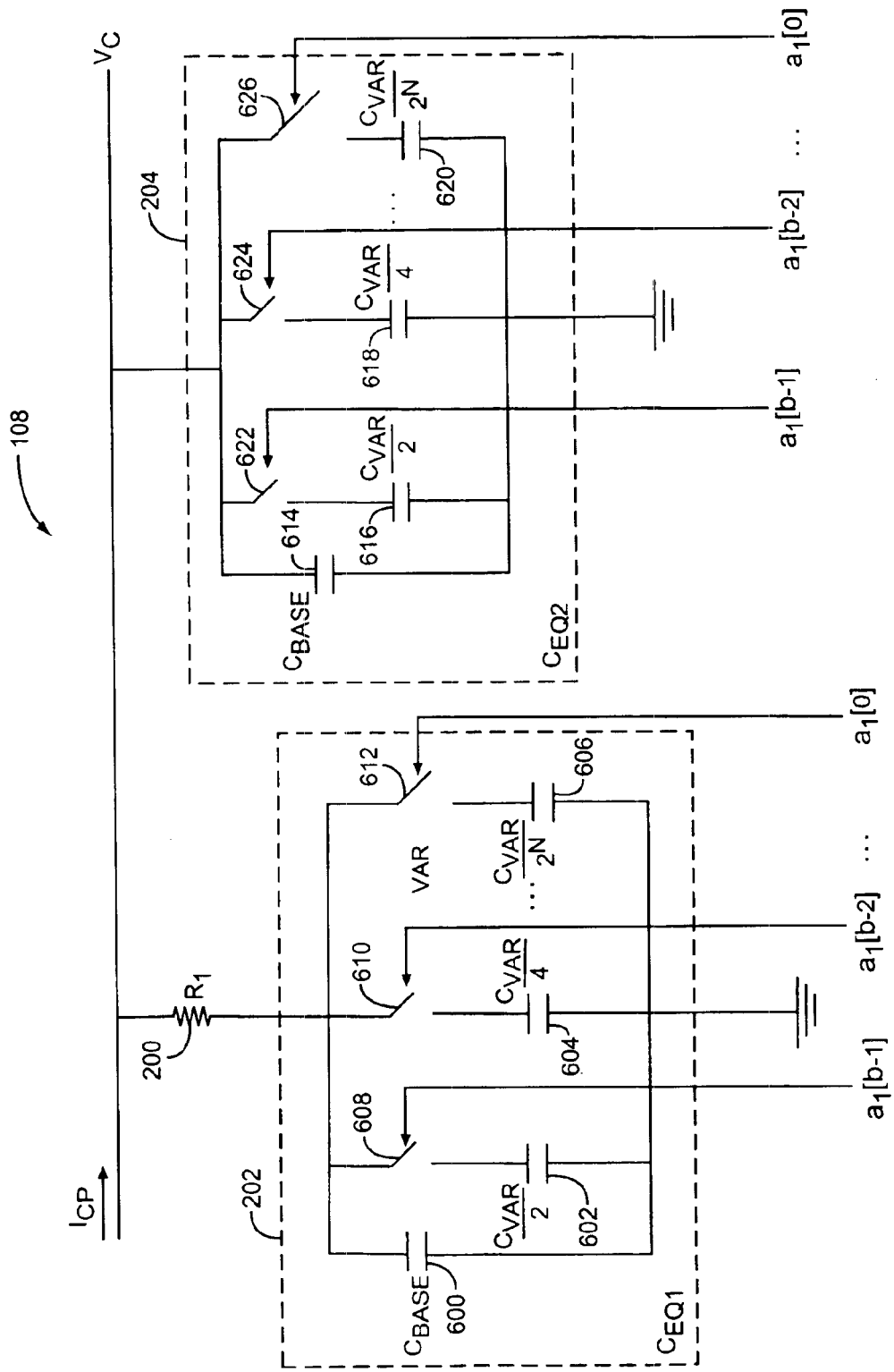
FIG. 6 is a detailed illustration of the loop filter according to one embodiment of the present invention.

FIG. 6 illustrates the exemplary embodiment of the loop filter 108 of FIG. 2 in more detail. In this embodiment, the loop filter 108 comprises the series combination of the resistor ($R_1$) 200 and the first variable capacitor array ($C_{EQ1}$) 202 connected in parallel with the second variable capacitor array ($C_{EQ2}$) 204. Further, the first variable capacitor array 202 comprises a base capacitor ($C_{base}$) 600 connected in parallel with variable capacitors ($C_{var}$) 602, 604, and 606. The capacitance of the first variable capacitor array 202 is controlled by the signal $a_1$ received from the calibration circuitry 112 either asserting or disserting one or more of switches 608, 610, and 612. More particularly, switches 608, 610, and 612 are controlled by associated bits $a_1[b-1]$, $a_1[b-2]$, and $a_1[0]$ in the $a_1$ signal. The second variable capacitor array 204 operates in a similar fashion to the first variable capacitor array 202 and comprises a base capacitor 614, variable capacitors 616, 618, and 620, and switches 622, 624, and 626. The values of the base capacitors 600 and 614 and the variable capacitors 602, 604, 606, 616, 618, and 620 depend on varying design constraints. Therefore, base capacitors 600 and 614 should not be limited to the case where the two are equal. Further, variable capacitors 602, 604, and 606 and variable capacitors 616, 618, and 620 should not be limited to the case where $C_{var}$ for the first variable capacitor array 202 is equal to $C_{var}$ for the second variable capacitor array 204. As shown, the preferred embodiments of the first and second variable capacitor arrays 202 and 204 use binary weighting, however, any other weighting scheme, such as unitary weighting, could be used and should be considered within the spirit and scope of the present invention.

Figure 7:
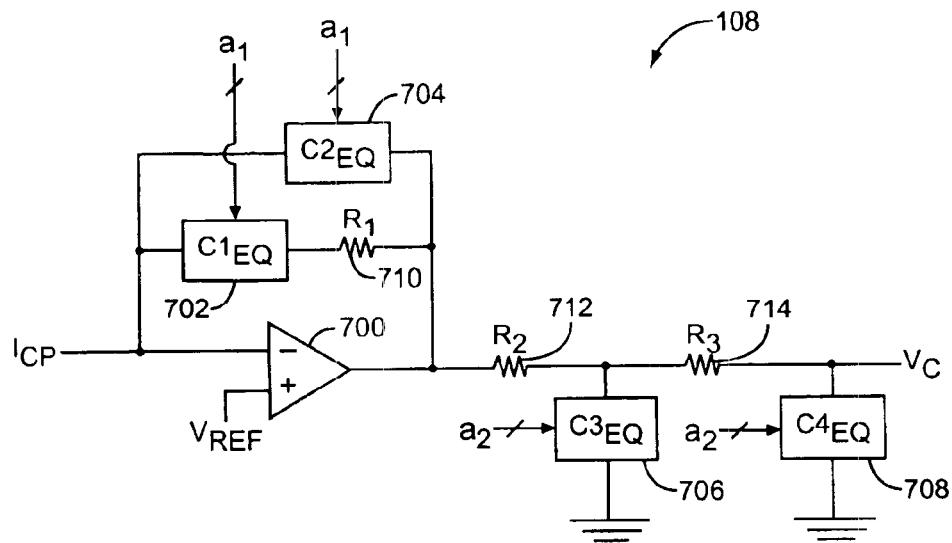
FIG. 7 illustrates a second exemplary embodiment of the loop filter.
Figure 8:
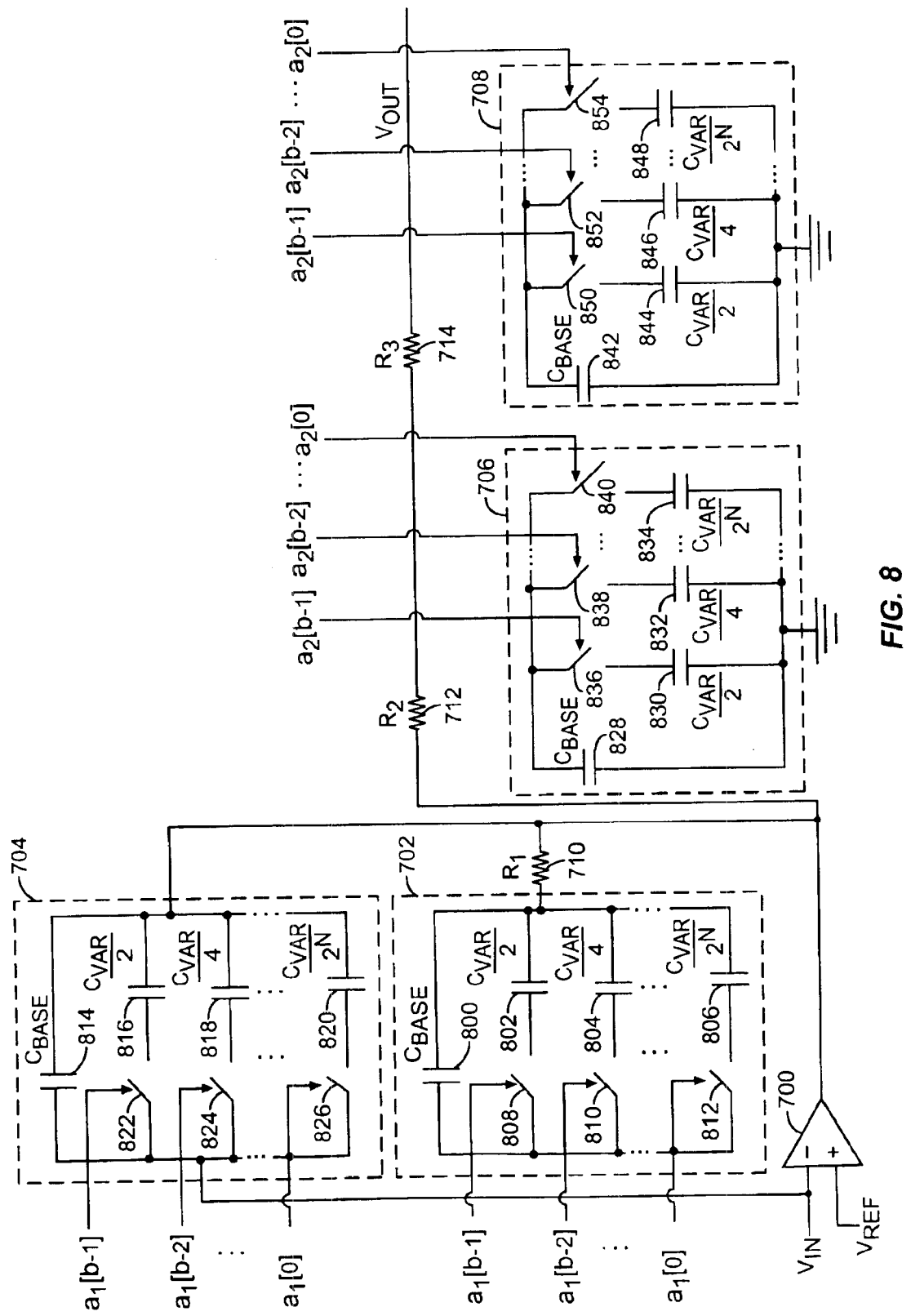
FIG. 8 is a detailed illustration of the loop filter of FIG. 7 according to one embodiment of the present invention.

FIGS. 7 and 8 illustrate a second exemplary embodiment of the loop filter 108. As illustrated in FIG. 7, the loop filter 108 includes an amplifier 700, variable capacitor arrays 702–708, and resistors 710–714. The variable capacitor arrays 702 and 704 are controlled by the first capacitance selection signal ($a_1$), and the variable capacitor arrays 706 and 708 are controlled by the second capacitance selection signal ($a_2$). The need for the two capacitance selection signals ($a_1$ and $a_2$) is due to the fact that the voltage across the variable capacitor arrays 702 and 704 is essentially $V_C-V_{REF}$ and the voltage across the variable capacitor arrays 706 and 708 is essentially $V_C$. Because the mapping logic 420 (FIG. 4) determines the correction factor ($X_C$) and thus the value of the corresponding one of the capacitance selection signals ($a_1-a_M$) based on the voltage across the corresponding variable capacitor array, separate capacitance selection signals are needed for the variable capacitor arrays 702 and 704 and the variable capacitor arrays 706 and 708. It should be noted that the reference voltage ($V_{REF}$) may be a known voltage or may alternatively be measured by the analog-to-digital converter 422 and passed to the mapping logic 420.

The generation of the first and second capacitance selection signals ($a_1$ and $a_2$) is as described above. First, the calibration circuit 112 generates the count value (count). From the count value (count), the mapping logic 420 determines the RC calibration value ($RC_{VAL}$). The RC calibration value is the same for both of the capacitance selection signals ($a_1$ and $a_2$). For the first capacitance selection signal ($a_1$), the mapping logic 420 then determines the voltage (v) across the variable capacitor arrays 702 and 704, which as illustrated in FIG. 7 is essentially $V_C-V_{REF}$. The reference voltage may be a known voltage or may be measured by the analog-to-digital converter 422. The mapping logic 420 then determines the correction factor ($X_C$) for the variable capacitor arrays 702 and 704 based on the voltage $V_C-V_{REF}$ and the known capacitance versus voltage characteristic of the variable capacitor arrays 702 and 704. Based on the correction factor ($X_C$) and the RC calibration value ($RC_{VAL}$), the mapping logic 420 provides the first capacitance selection signal ($a_1$).

The mapping logic 420 provides the second capacitance selection signal ($a_2$) in a similar fashion. The mapping logic 420 determines the voltage (v) across the variable capacitor arrays 706 and 708, which as illustrated in FIG. 7 is essentially $V_C$. The reference voltage $V_C$ is measured and provided to the mapping logic by the analog-to-digital converter 422. The mapping logic 420 then determines the correction factor ($X_C$) for the variable capacitor arrays 706 and 708 based on the voltage $V_C$ and the known capacitance versus voltage characteristic of the variable capacitor arrays 706 and 708. Based on the correction factor ($X_C$) and the RC calibration value ($RC_{VAL}$), the mapping logic 420 provides the second capacitance selection signal ($a_2$).

FIG. 8 is a more detailed illustration of the loop filter 108 of FIG. 7. As illustrated, the variable capacitor array 702 comprises a base capacitor ($C_{base}$) 800 connected in parallel with variable capacitors ($C_{var}$) 802, 804, and 806. The capacitance of the variable capacitor array 702 is controlled by the signal a, received from the calibration circuitry 112 either asserting or disserting one or more of switches 808, 810, and 812. More particularly, switches 808, 810, and 812 are controlled by associated bits $a_1[b-1]$, $a_1[b-2]$, and $a_1[0]$ in the $a_1$ signal. Similarly, the variable capacitor array 704 comprises a base capacitor ($C_{base}$) 814 connected in parallel with variable capacitors ($C_{var}$) 816, 818, and 820. The capacitance of the variable capacitor array 704 is controlled by the signal a, received from the calibration circuitry 112 either asserting or disserting one or more of switches 822, 824, and 826. More particularly, switches 822, 824, and 826 are controlled by associated bits $a_1[b-1]$, $a_1[b-2]$, and $a_1[0]$ in the a, signal.

The variable capacitor array 706 operates in a similar fashion to the variable capacitor arrays 702 and 704 and comprises a base capacitor 828, variable capacitors 830, 832, and 834, and switches 836, 838, and 840. The variable capacitor array 708 operates in a similar fashion to the variable capacitor arrays 702, 704, and 706 and comprises a base capacitor 842, variable capacitors 844, 846, and 848, and switches 850, 852, and 854. Each of the variable capacitor arrays 706 and 708 is similar in structure and operation to the variable capacitor arrays 702 and 704. However, as discussed above, the capacitor arrays 702 and 704 are controlled by the first capacitance selection signal (a$_1$), and the variable capacitor arrays 706 and 708 are controlled by the second capacitance selection signal (a$_2$).

The values of the base capacitors 800, 814, 828, and 842 and the variable capacitors 802, 804, 806, 816, 818, 820, 830, 832, 834, 844, 846, and 848 depend on varying design constraints. Therefore, base capacitors 800 and 814 of the variable capacitor arrays 702 and 704 should not be limited to the case where the two are equal. Similarly, base capacitors 828 and 842 of the variable capacitor arrays 706 and 708 should not be limited to the case where the two are equal. Further, variable capacitors 802, 804, and 806 and variable capacitors 816, 818, and 820 should not be limited to the case where $C_{var}$ for the variable capacitor array 702 is equal to $C_{var}$ for the variable capacitor array 704. Similarly, the variable capacitors 830, 832, and 834 and variable capacitors 844, 846, and 848 should not be limited to the case where $C_{var}$ for the variable capacitor array 706 is equal to $C_{var}$ for the variable capacitor array 708.

As shown, the preferred embodiments of the variable capacitor arrays 702, 704, 706, and 708 use binary weighting, however, any other weighting scheme, such as unitary weighting, could be used and should be considered within the spirit and scope of the present invention.

Figure 9:
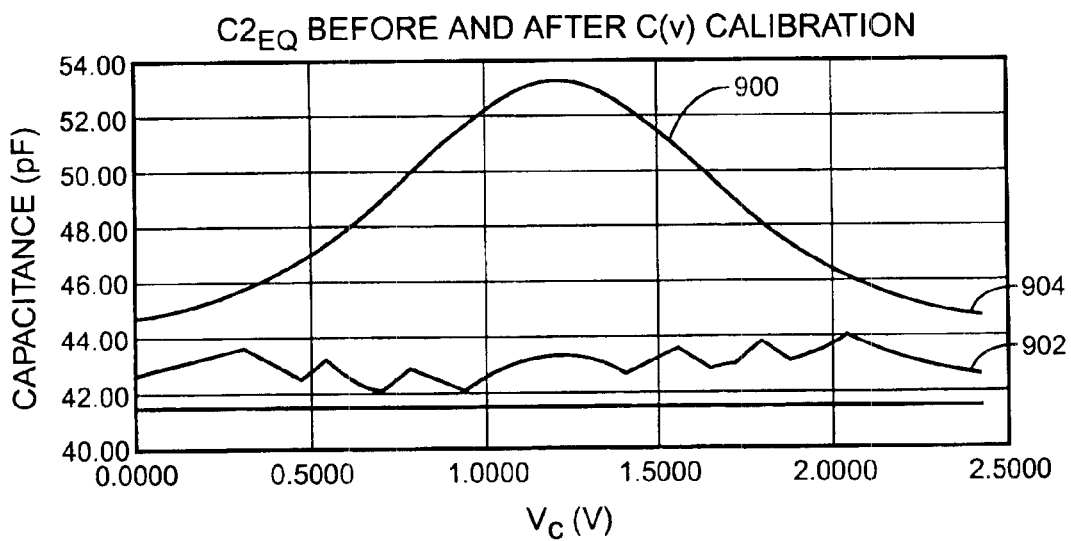
FIG. 9 is a graphical illustration of the improved voltage linearity of a variable capacitor array according to one embodiment of the present invention.

FIG. 9 illustrates the improved voltage linearity of the one of the variable capacitors 202 or 204 (FIGS. 2 and 6) or variable capacitors 702–708 (FIGS. 7 and 8). The voltage non-linearity of the capacitor is illustrated by line 900, which is the capacitance versus voltage characteristic of the capacitor. Line 902 is a nominal value of the capacitor, and line 904 is the capacitance of the capacitor having been calibrated by the calibration circuit 112 to compensate for voltage non-linearity. Thus, as clearly illustrated, the calibration circuit 112 of the present invention substantially reduces the voltage non-linearity of the variable capacitor arrays.

Although the present invention is described as being part of the PLL 100, it should be recognized that the present invention may be used in any system where it is desirable to correct the voltage non-linearity of one or more capacitors. Further, although the present invention is described as adjusting the RC calibration value (RC$_{VAL}$) to compensate for the voltage non-linearity of the elements of the variable capacitor arrays, it should be recognized that the present invention may be implemented independent of the RC calibration value. For example, an alternative embodiment of the calibration circuit 112 may operate to compensate for voltage non-linearity of the variable capacitance arrays in the loop filter 108 without calibrating the RC time constant and slew rate. In this embodiment, the calibration circuit 112 may comprise only the mapping logic 420, the analog-to-digital converter 422, and the LUT 424 and operate to provide the capacitance selection signals (a$_1$, a$_2$, . . . ) based on mapping the control voltage (V$_C$) or more specifically the voltage across the variable capacitor arrays to corresponding values for the capacitance selection signals (a$_1$, a$_2$, . . . ).

Those skilled in the art will recognize improvements and modifications to the preferred embodiments of the present invention. All such improvements and modifications are considered within the scope of the concepts disclosed herein and the claims that follow.

We claim:

1. A system comprising:
   a variable capacitor array having a selectable capacitance responsive to a capacitance selection signal; and
   a calibration circuit adapted to generate the capacitance selection signal based on a voltage across the variable capacitor array and a capacitance versus voltage characteristic of the variable capacitor array such that the selectable capacitance is adjusted to compensate for voltage non-linearity of the variable capacitor array.

2. The system of claim 1 wherein the variable capacitor array forms part of a loop filter in a phase-locked loop.

3. The system of claim 2 wherein the calibration circuitry comprises:
   a capacitance circuit adapted to receive a timing current wherein the timing current charges the capacitance circuit; and
   a detection and control circuit adapted to:
   determine a charging time associated with the capacitance circuit;
   determine a first calibration value based on the charging time;
   determine a correction factor based on the voltage across the variable capacitor array and the capacitance versus voltage characteristic of the variable capacitor array; and
   adjust the first calibration value using the correction factor, thereby providing the capacitance selection signal such that the selectable capacitance is adjusted to compensate for voltage non-linearity of the variable capacitor array and calibrate the RC time constant of the loop filter.

4. The system of claim 3 wherein the calibration circuit comprises mapping logic adapted to determine the first calibration value based on the charging time.

5. The system of claim 4 wherein the mapping logic is further adapted to determine the correction factor based on the voltage across the variable capacitor array and the capacitance versus voltage characteristic of the variable capacitor array.

6. The system of claim 5 wherein the calibration circuit further comprises a look-up table and the mapping logic is further adapted to determine the correction factor by selecting a value from the look-up table based on the voltage across the variable capacitor array.

7. The system of claim 5 wherein the mapping logic is further adapted to adjust the first calibration value using the correction factor, thereby providing the capacitance selection signal such that the selectable capacitance is adjusted to compensate for voltage non-linearity of the variable capacitor array and calibrate the RC time constant of the loop filter.

8. The system of claim 5 wherein the correction factor is defined as a desired capacitance value divided by an actual capacitance value corresponding to the voltage across the variable capacitance array when the first calibration value is at a nominal value.

9. The system of claim 3 further comprising digitization circuitry adapted to digitize a control voltage output from the loop filter wherein the voltage across the variable capacitor array is a function of the control voltage.

10. The system of claim 2 wherein the loop filter comprises at least one additional variable capacitor array having a second selectable capacitance responsive to a second capacitance selection signal.

11. The system of claim 10 wherein the calibration circuit is further adapted to generate the second capacitance selection signal based on a second voltage across the at least one additional variable capacitor array and a capacitance versus voltage characteristic of the at least one additional variable capacitor array such that the second selectable capacitance is adjusted to compensate for voltage non-linearity of the at least one additional variable capacitor array.

12. A method of calibrating a phase-locked loop (PLL) having a loop filter, the method comprising:
    determining a voltage across a variable capacitor array in the loop filter; and
    generating a capacitance selection signal for selecting a capacitance of the variable capacitor array in a loop filter based on the voltage across the variable capacitor array and a capacitance versus voltage characteristic of the variable capacitor array such that the capacitance is adjusted to compensate for voltage non-linearity of the variable capacitor array.

13. The method of claim 12 wherein generating the capacitance selection signal comprises:
    charging a capacitance circuit with a timing current;
    determining a charging time associated with the charging of the capacitance circuit;
    determining a first calibration value based on the charging time;
    determining a correction factor based on the voltage across the variable capacitor array and the capacitance versus voltage characteristic of the variable capacitor array; and
    adjusting the first calibration value using the correction factor, thereby generating the capacitance selection signal such that the selectable capacitance is adjusted to compensate for voltage non-linearity of the variable capacitor array and calibrate the RC time constant of the loop filter.

14. The method of claim 13 wherein the step of determining the correction factor comprises selecting a value from a look-up table based on the voltage across the variable capacitor array.

15. The method of claim 13 wherein the step of determining a first calibration value based on the charging time provides the first calibration value which corresponds to a value for the capacitance selection signal that calibrates the RC time constant of the loop filter.

16. The method of claim 12 wherein the step of determining the voltage across the variable capacitor array further comprises digitizing a control voltage output from the loop filter and determining the voltage across the variable capacitor array based on the control voltage.

17. The method of claim 12 further comprising:
    determining a voltage across at least one additional variable capacitor array in the loop filter; and
    generating a second capacitance selection signal for selecting a second capacitance of the at least one additional variable capacitor array in a loop filter based on a second voltage across the at least one additional variable capacitor array and a capacitance versus voltage characteristic of the at least one additional variable capacitor array such that the second capacitance is adjusted to compensate for voltage non-linearity of the at least one additional variable capacitor array.

18. A system for calibrating a phase-locked loop (PLL) having a loop filter, the system comprising:
    means for determining a voltage across a variable capacitor array in the loop filter; and
    means for generating a capacitance selection signal for selecting a capacitance of the variable capacitor array in a loop filter based on the voltage across the variable capacitor array and a capacitance versus voltage characteristic of the variable capacitor array such that the capacitance is adjusted to compensate for voltage non-linearity of the variable capacitor array.

19. The system of claim 18 wherein the means for generating the capacitance selection signal comprises:
    means for charging a capacitance circuit with a timing current;
    means for determining a charging time associated with the charging of the capacitance circuit;
    means for determining a first calibration value based on the charging time;
    means for determining a correction factor based on the voltage across the variable capacitor array and the capacitance versus voltage characteristic of the variable capacitor array; and
    means for adjusting the first calibration value using the correction factor, thereby generating the capacitance selection signal such that the selectable capacitance is adjusted to compensate for voltage non-linearity of the variable capacitor array and calibrate the RC time constant of the loop filter.

20. The system of claim 19 wherein the means for determining the correction factor is further adapted to select a value from a look-up table based on the voltage across the variable capacitor array.

21. The system of claim 19 wherein the means for determining the first calibration value based on the charging time provides the first calibration value which corresponds to a value for the capacitance selection signal that calibrates the RC time constant of the loop filter.

22. The system of claim 18 wherein the means for determining the voltage across the variable capacitor array is further adapted to digitizing a control voltage output from the loop filter and determine the voltage across the variable capacitor array based on the control voltage.

23. The system of claim 18 further comprising:
    means for determining a voltage across at least one additional variable capacitor array in the loop filter; and
    means for generating a second capacitance selection signal for selecting a second capacitance of the at least one additional variable capacitor array in a loop filter based on a second voltage across the at least one additional variable capacitor array and a capacitance versus voltage characteristic of the at least one additional variable capacitor array such that the second capacitance is adjusted to compensate for voltage non-linearity of the at least one additional variable capacitor array.

* * * * *